United States Patent [19]
Wakita et al.

[11] Patent Number: 5,546,889
[45] Date of Patent: Aug. 20, 1996

[54] METHOD OF MANUFACTURING ORGANIC ORIENTED FILM AND METHOD OF MANUFACTURING ELECTRONIC DEVICE

[75] Inventors: Katsuya Wakita, Nara; Shu Hotta, Kawasaki; Nobuo Sonoda, Settsu, all of Japan; Yang Yang, Santa Barbara, Calif.

[73] Assignee: Matsushita Electric Industrial Co., Ltd., Osaka, Japan

[21] Appl. No.: 315,354

[22] Filed: Sep. 30, 1994

Related U.S. Application Data

[63] Continuation-in-part of Ser. No. 132,348, Oct. 6, 1993.

[51] Int. Cl.$^6$ .................................................. C30B 29/54
[52] U.S. Cl. ............................ 117/84; 117/925; 117/927
[58] Field of Search ................................. 117/925, 927, 117/84

[56] References Cited

U.S. PATENT DOCUMENTS

| | | | |
|---|---|---|---|
| 4,446,620 | 5/1984 | Proskow | 430/286 |
| 4,923,288 | 5/1990 | Allen et al. | 350/355 |
| 5,142,343 | 8/1992 | Hosokawa et al. | 357/17 |
| 5,180,470 | 11/1993 | Smith et al. | 117/925 |
| 5,284,779 | 2/1994 | Miyanaga | 117/925 |

FOREIGN PATENT DOCUMENTS

| | | | |
|---|---|---|---|
| 04133351 | 5/1992 | Japan | 117/925 |
| 913584 | 3/1991 | WIPO | 117/927 |

*Primary Examiner*—Robert Kunemund
*Attorney, Agent, or Firm*—Fish & Richardson PC

[57] ABSTRACT

A method of manufacturing an organic electronic device having a substrate and a pair of electrodes facing each other, including the steps of forming a polytetrafluoroethylene oriented film on a substrate, and contacting an oligothiophene compound with the polytetrafluoroethylene oriented film to form an organic oriented film on the polytetrafluoroethylene oriented film between the pair of electrodes wherein the long axis of oligothiophene molecules is oriented to the orientation of the polytetrafluoroethylene oriented film and crystallized.

16 Claims, 9 Drawing Sheets

METHOD OF MANUFACTURING ORGANIC ORIENTED FILM AND METHOD OF MANUFACTURING ELECTRONIC DEVICE

This is a continuation-in-part of U.S. patent application Ser. No. 08/132,348 filed Oct. 6, 1993.

FIELD OF THE INVENTION

This invention relates to a method of manufacturing oriented films using conductive materials such as conducting oligomers or polymers, and a method of manufacturing electronic devices, such as a field effect transistor (FET), using the oriented film.

BACKGROUND OF THE INVENTION

A variety of electronic devices using organic materials such as conducting oligomers or polymers have been proposed. Examples of such organic materials include conducting polymers having a conjugated double bond, such as polyacetylene, and organic compounds having a relatively low molecular weight, such as oligothiophene or phthalocyanine. Those organic materials have $\pi$ electrons, which are freely movable in a molecule. The mobility of electrons or holes in those materials is an important consideration in the formation electronic devices.

The orientation of molecules or molecular chains is one of the important factors influencing the conductivity of conductive materials.

Conventional methods of orienting organic electronic materials include the following:

natural orientation due to an interaction among molecules or molecular chains that is characteristic of the compounds;

selectively orienting the compounds in the process of forming a conductive polymer by providing a fine groove on a substrate surface and filling the groove with a reaction catalyst disclosed in Japanese Unexamined Patent Publication No. Hei 3-21861;

orienting a conductive polymer by fixing both ends of a wet conductive polymer during the process of forming the conductive polymer through electrolytic polymerization, and gradually drying and processing the polymer with heat, thus orienting the polymer due to its shrinkage disclosed in Japanese Unexamined Patent Publication No. Hei 2-44607; and orienting a conductive polymer by fixing both ends of the polymer and mechanically drawing the polymer.

The orientation of a conductive oligomer is generally created by natural orientation due to an interaction among substituents of the molecules or van der Waals force.

Among various electronic devices, field effect transistors (FET) are used as a driving device in a liquid crystal display and the like. Conventional conducting organic materials for the devices include $\pi$-conjugated compounds such as polypyrrole, polythiophene, which are disclosed in Japanese Unexamined Patent Publication HEI 3-255669, and oligothiophene compounds, which is disclosed in Gilles Horowitz et al., Molecular Electronics, 7, 85 (1991).

However, it has been difficult for the above-noted conventional technologies to orient large areas of conductive materials or thin films of these materials. When a conductive material is applied to an electronic device, conduction carriers (electrons or holes) should have high mobility without being trapped. However, no good method has been found for orienting oligothiophene as a conductive material.

To solve the above problem, T. Dyreklev proposed the use of polythiophene derivatives mechanically stretched and oriented (Synthetic Metals, 57, 4093 (1993)). However, this procedure provided an insufficiently low mobility of $10^{-5} cm^2/V \cdot s$ at most. The method of manufacturing devices, for example, FET devices, included adhesion of films mechanically stretched to gate insulating films. This process is difficult to carry out industrially, and the adhesion is unsatisfactory.

A molecular arrangement technique employing a polytetrafluoroethylene (PTFE) oriented film has been used mainly for polymer materials, and its usefulness has been realized. However, the usefulness of the above-mentioned technique for orienting materials which have rigid molecular structures and comparatively low molecular weights, such as conductive oligomers, has not been established.

In order to solve these problems with the conventional materials, the invention applies the above-noted molecular arrangement technique to oligothiophene materials, thus establishing the usefulness of the molecular arrangement technique employing a PTFE oriented film, highly orienting large areas of conductive materials or thin films of the materials, and improving the mobility of conduction carriers (electrons or holes).

The invention provides an improved organic electronic device by improving the orientation of organic materials for increasing the mobility of carriers. Specifically, the invention uses an oligothiophene compound, a polyphenylene vinylene compound, or a mixture of at least two oligothiophene compounds. Those compounds are epitaxially deposited on a PTFE oriented film and oriented.

SUMMARY OF THE INVENTION

The invention provides a method of manufacturing a conducting organic oriented film comprising the steps of forming a polytetrafluoroethylene oriented film on a substrate, and contacting an oligothiophene compound represented by Formula (1) with the polytetrafluoroethylene oriented film.

Formula (1)

wherein n represents an integer of 3 to 6, and R represents a hydrogen atom or an alkyl group having 1 to 2 carbon atoms.

It is preferable that the step of contacting the oligothiophene compound with the polytetrafluoroethylene oriented film is carried out using a gaseous-phase method or a casting method.

It is preferable that the polytetrafluoroethylene oriented film is heated when the oligothiophene compound is contacted with the polytetrafluoroethylene oriented film.

It is preferable that the oligothiophene compound has a polymerization degree between four and six.

It is preferable that the $\alpha$ position at the ends of the oligothiophene molecules is substituted by a group selected from the group consisting of alkyl groups, alkylthio groups and trimethylsilyl groups.

It is preferable that the alkyl group or alkylthio group has one or two carbon atoms.

The invention provides a first method of manufacturing an organic electronic device having a substrate and a pair of electrodes facing each other, comprising the steps of forming a polytetrafluoroethylene oriented film on a substrate, and contacting an oligothiophene compound with the polytetrafluoroethylene oriented film to form an organic oriented film on the polytetrafluoroethylene oriented film between the pair of electrodes wherein the long axis of oligothiophene molecules is oriented to the orientation of the polytetrafluoroethylene oriented film and crystallized.

It is preferable that at least two oligothiophene compounds are contacted with the polytetrafluoroethylene oriented film.

The invention provides a second method of manufacturing an organic electronic device having a substrate and a pair of electrodes facing each other, comprising the steps of forming a polytetrafluoroethylene oriented film on a substrate, and contacting a polyphenylene vinylene represented by Formula (2) or its derivative with the polytetrafluoroethylene oriented film to form an organic oriented film on the polytetrafluoroethylene oriented film between the pair of electrodes.

Formula (2)

wherein n represents an integer.

It is preferable that the polyphenylene vinylene derivative is poly(2-methoxy,5-(2'-ethylhexyloxy)-1,4-phenylene vinylene) represented by Formula (3).

Formula (3)

wherein n represents an integer.

In Formulas (2) and (3), n is preferably 10 or more.

It is preferable in the second method that the step of contacting the polyphenylene vinylene or its derivative with the polytetrafluoroethylene oriented film is carried out using a casting method.

DETAILED DESCRIPTION OF THE INVENTION

According to the method of the invention, oligothiophene compounds can readily be formed into an oriented film on PTFE oriented film by a gaseous-phase method or a casting method.

The oligothiophene compound with four polymerization degrees (tetramer) has $10^{-10}$S/cm electric conductivity while the one with five polymerization degrees (pentamer) has $10^{-8}$S/cm electric conductivity. The oligothiophene compound with six polymerization degrees (hexamer), moreover, has $10^{-6}$S/cm electric conductivity, as disclosed in J. Molecular Electronics, 7, 85 (1991). Therefore, it is preferable to use the compounds as conductive materials for electronic devices. The oligothiophene compound with five polymerization degrees has a mobility of $10^{-5}$cm$^2$/V·s, and the compound with six polymerization degrees has a mobility of $5\times10^{-3}$–$4\times10^{1}$cm$^2$/V·s. Thus, the compound is useful for manufacturing electronic devices that use organic materials.

Polyphenylene vinylene and its derivatives having high mobilities are also suitable for use as conductive materials applied for electronic devices.

The improvement of the orientation of oligothiophene, polyphenylene vinylene and its derivatives leads to improved mobility as well electronic as properties. In particular, oligothiophene compounds are preferable because they have high crystallinity and easy to be oriented.

By applying a gaseous-phase method or a casting method as the method of contacting the oligothiophene compounds to the PTFE oriented film, the thickness of the piled oligothiophene layers can be freely controlled. Moreover, the orientation property of the oligothiophene layers can also be improved by heating the PTFE oriented film during the stage of building up the oligothiophene layer by the gaseous-phase method. In other words, the orientation and size of the partially oriented oligothiophene crystals can be highly improved by heating the PTFE oriented film.

Further, the use of at least two oligothiophene compounds provides remarkable effects. The oligothiophene compounds can have polymerization degrees different from each other or substituents, particularly at the a position of oligothiophene molecule, different from each other even if the polymerization degrees are identical.

When an electronic device is driven, charged species are generated in the organic electronic material. The dimerization of those charged species increases the activated energy for conduction. The mixture of materials seems to prevent this activated energy from increasing. The stabilization due to dimerization of charged species is disclosed in S. Hotta et al, J. Phys. Chem., 97, 7427 (1993). The orientation of at least two oligothiophene compounds in one direction at a time is preferred.

The electron mobility of the oligothiophene derivative, in which the α position at the end of the molecules is substituted with an alkyl group, is higher than that of the oligothiophene compound in which the a position is not replaced with the group (H. Akimichi et al., Appl. Phys. Lett., 58 (14), 1500 (1991)), even though there is no specific reason for the change. The use of such oligothiophene derivative enables manufacture of electronic devices having excellent properties. The oligothiophene derivative in which the ends of molecules are substituted with an alkylthio group or trimethylsilyl group is also suitable. Preparation of oligothiophene derivatives comprising an alkylthio group or trimethylsilyl group is disclosed, for example, in S. Hotta, K. Waragai, J. Mater. Chem., 1, 835 (1991), M. G. Hill et al, Chemistry of Materials, 4, 1106 (1992), and J. Guay et al, Chemistry of Materials, 4, 254 (1992).

The orientation of conducting materials is attributed to epitaxial growth on PTFE oriented film. By using this method, a long axis of oligothiophene compound and a molecular chains of polyphenylene compound are oriented parallel to PTFE molecular chains.

In addition, conducting polymers having $\pi$ electrons or oligomer compounds having a similar structure, include polyacetylene, polythiophene, polypyrrole, polyphenylene sulfide, polyphenylene, polythienylene vinylene, oligophenylene vinylene, are applied to the invention. Those conducting polymers are disclosed in Handbook of Conducting Polymers, Vols. 1 and 2. Preparation, structure and properties of the oligomer compounds are disclosed in W. T. Hoeve et al, J. American Chem. Soc., 113, 5887 (1991), A. Takimoto et al, Jpn. J. Appl. Phys., 32, 971 (1993), A. Sakamoto et al, Synthetic Metals, 55, 593 (1993), C. J. Toussaint, Acta Cryst., 21, 1002 (1966) and the like.

As disclosed in the report of Wittmann et al., the PTFE oriented film can be formed by a simple process such as, for example, pressing a rod of PTFE on a substrate of glass, silicon wafer or the like and sliding it in one direction. A conducting organic material is readily oriented by directly contacting it with the PTFE oriented film thus formed. The contacting can be performed by a conventional procedure, such as vapor deposition or a casting method.

The invention will hereinafter be described in detail with reference to Examples and the drawings.

The oligothiophene compounds of the invention are preferably oligothiophene derivatives of oligothiophene with at least three polymerization degrees and comprising methyl or ethyl groups as substituents. Particularly, an oligothiophene having four to six polymerization degrees and an alkyl group bonded to the $\alpha$ position at the end of molecular chains is preferable in the invention. When the oligothiophene derivative comprising alkyl groups are used, the hydrophobic interaction of alkyl groups bonded to the end of molecular chains can significantly improve the crystalline of oligothiophene and the affinity of the PTFE layer for the oligothiophene layer. So, the orientation property of the oligothiophene layers is improved. More specifically, preferred oligothiophene derivatives include terthienyl (trimer); quaterthienyl (tetramer); quinquethienyl (pentamer); sexithienyl (hexamer); 5,5"-dimethyl terthiophene; 5,5'"-dimethyl quaterthiophene; 5,5""-dimethyl quinquethiophene; 5,5""'-dimethyl sexithiophene; 5,5"-diethyl terthiophene; 5,5'"-diethyl quaterthiophene; 5,5""-diethyl quinquethiophene and 5,5""'-diethyl sexithiophene. It is preferable that the alkyl group bonded to the $\alpha$ position at the oligothiophene molecular end comprises one or two carbon atoms; however, the number of carbon atoms is not limited to these numbers. Oligothiophenes having a polymerization degree of seven or more are similarly used in the invention. Preparation of oligothiophene compounds having a polymerization degree of eleven is disclosed in W. T. Hoeve et al, Journal of American Chemical Society, 113, 5887 (1991). D. Fishou discloses in Organic Materials for Nonlinear Optics, Royal Society Chem. (London, 1989) that an energy gap of oligothiophene compounds having a polymerization degree up to fourteen decreases with increasing polymerization degree.

The PTFE oriented film used in the invention can be formed by the method of 3. C. Wittmann and P. Smith (Nature, Vol. 352, 414 (1991)). More specifically, the PTFE oriented film formed on substrates with smooth surfaces such as a glass substrate or a silicon substrate is heated, and the PTFE rod is slid applying the pressure to the substrates. As a result, a PTFE oriented film is formed in which molecular chains are oriented in the direction of sliding.

Methods of contacting oligothiophene to PTFE oriented films include, for example, gaseous-phase methods such as the vacuum deposition method, CVD method, MBE method or the like, casting methods including the spin coating method, blade coating method or the like and a solid-phase method (applicable to compounds with a 340° C. or below melting point of the PTFE films). In a solid-phase method, oligothiophene compounds are melted and solidified on a PTFE oriented film. The method of forming a film of polyphenylene or its derivatives include, for example, a casting method including the spin coating method, blade coating method or the like and the solid-phase method.

In the casting method, it is preferable to use chlorobenzene, chloroform, methyl chloride, acetone, xylene, 1,2,4-trichlorobenzene, dimethylformamide (DMF) or the like as the agent dissolving oligothiophene.

The method of manufacturing an FET will be explained with reference to FIG. 8(a) to 8(d).

Figure 8A:
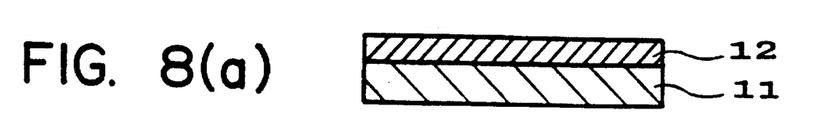
FIG. 8(a) to 8(d) show processes of manufacturing an organic electronic device according to one embodiment of the invention.

(1) Gate insulating layer 12 of $SiO_2$ is formed on n-doped substrate 11 by thermally oxidizing one surface of substrate 11.

Figure 8B:
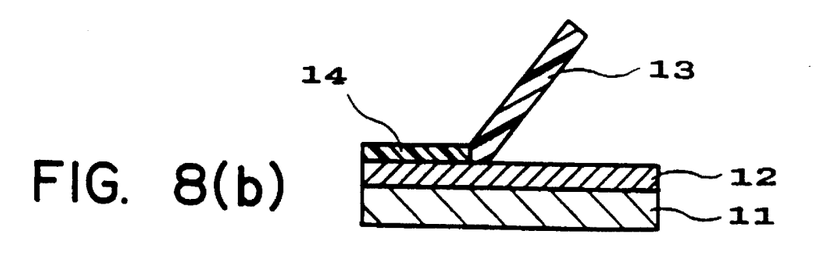

(2) Rod 13 of PTFE is pressed on gate insulating layer 12 at an appropriate pressure and is slid in one direction at a constant rate, for example, 1 mm/sec, to layer PTFE oriented film having a thickness of about 100 nm on gate insulating layer 12. During the process, substrate 11 is heated at an appropriate temperature, for example, 300° C.

Figure 8C:
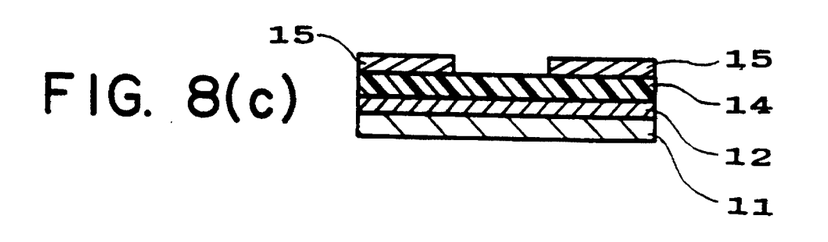

(3) Ctenoid-shaped source and drain electrodes 15 are provided on PTFE oriented film 14 by depositing chromium and gold on PTFE oriented film 14 using a vacuum deposition apparatus.

Figure 8D:
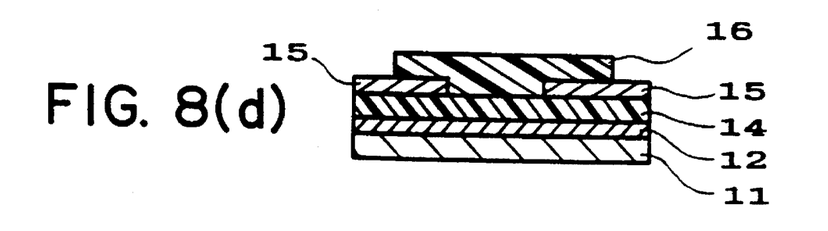

(4) Organic layer 16 is formed on and between source and drain electrodes 15 by depositing from gaseous-phase or casting from fluid.

(5) The other surface of silicon substrate 11, on which nothing is deposited, is polished to produce gate electrodes from substrate 11 itself. Gold lines for a lead are connected with each of three electrodes with silver paste.

For gate insulating layer 12, inorganic materials such as $SiO_2$ or $Ta_2O_5$, and organic insulating materials such as cyanoethyl pullulan or polyvinyl alcohol; however, the kind of the materials is not limited to those materials. The spin coating method can be used to form gate insulating layer 12 from organic insulating materials.

According to the method of the invention, any electronic devices having a conducting organic layer disposed between a pair of electrodes facing each other, other than an FET.

The invention is explained further in detail by referring to the following examples.

EXAMPLE 1

Figure 1:
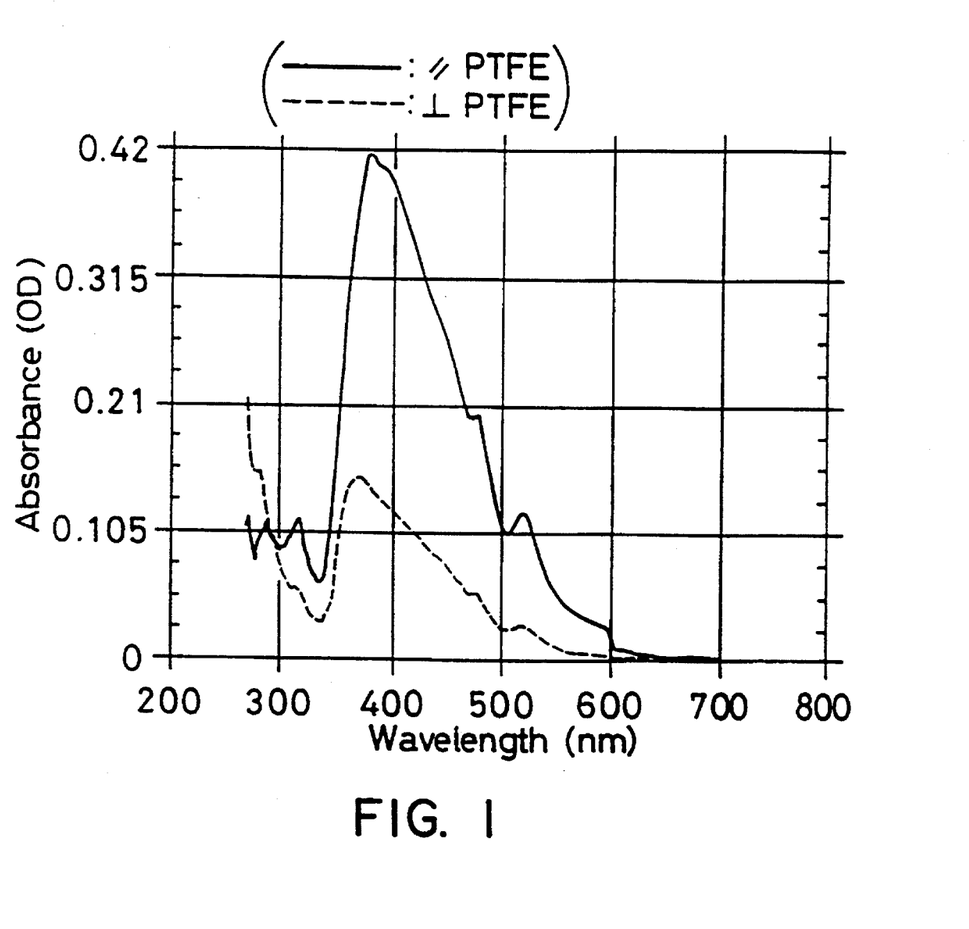
FIG. 1 shows a polarization absorption spectrum of the DMSxT film of Example 1.
Figure 2A:
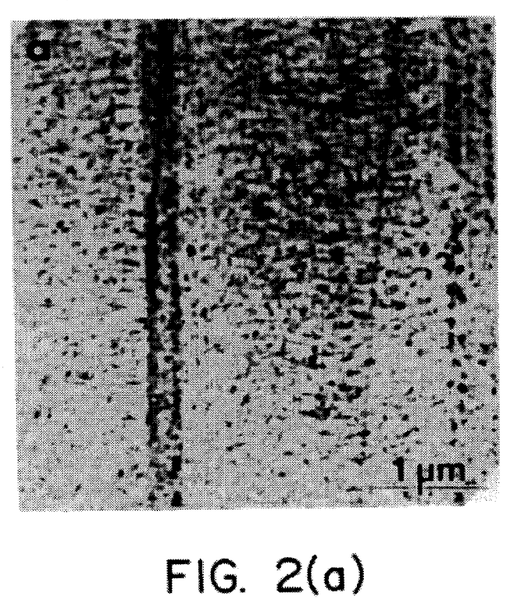
FIG. 2(a) and 2(b) show a TEM picture of the DMSxT film and an electron beam diffraction spectrum of the DMSxT film of Example 1, respectively.
Figure 2B:
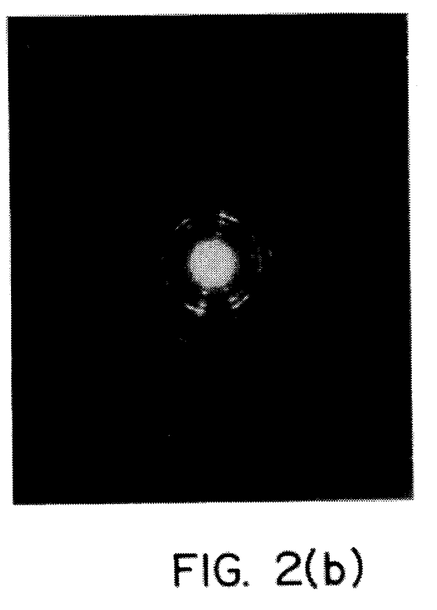

A glass substrate formed with a PTFE oriented film was placed in a vacuum deposition apparatus, and 5,5""'-dimethyl sexithiophene (DMSxT) was deposited on the glass substrate under $1\times10^{-5}$ Torr degree of vacuum. More specifically, 10 mg of DMSxT was placed in a tungsten boat, and the deposition of DMSxT to the glass substrate was promoted by resistance heating while the distance between the deposition source and the substrate surface was kept at 10 cm. For the above-noted procedure, 29–30 Amps of electric current was supplied to the deposition source. A TEM (Transmission Electron Microscope) was used to observe the DMSxT film formed on the PTFE oriented film, and the dichroism of the absorption spectrum was also measured. FIG. 1 shows the absorption spectrum of the DMSxT film. The absorption of oligothiophene molecules in the direction parallel to the PTFE molecular chains was significantly large according to this observation. Particularly, with 3.4 eV photoabsorption energy at $\pi$–$\pi$* transition, the ratio of the absorption intensity of the oligothiophene molecules parallel to the PTFE molecular chain direction (oriented direction of PTFE) to the absorption intensity of the molecules perpendicular to the PTFE molecular chain direction was about 1.94. In case of depositing DMSxT directly on a glass substrate which was not formed with a PTFE oriented film, the oligothiophene molecular chains were crystallized in the vertical direction to the substrate surface. When depositing DMSxT on the PTFE oriented film, the oligothiophene molecular chains were crystallized parallel to the PTFE oriented direction. FIG. 2(a) is a TEM picture of an oriented DMSxT film. FIG. 2(b) is an electron beam diffraction diagram of an oriented DMSxT film.

EXAMPLE 2

Figure 3:
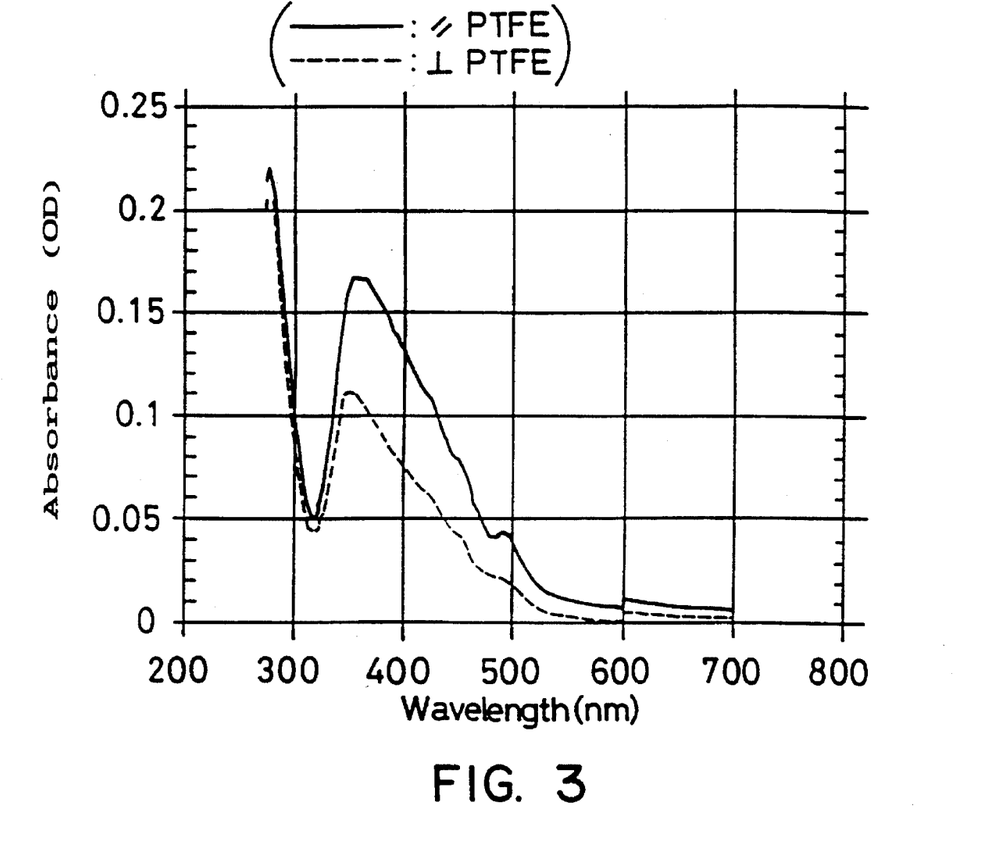
FIG. 3 shows a polarization absorption spectrum of the DMQqT film of Example 2.
Figure 4A:
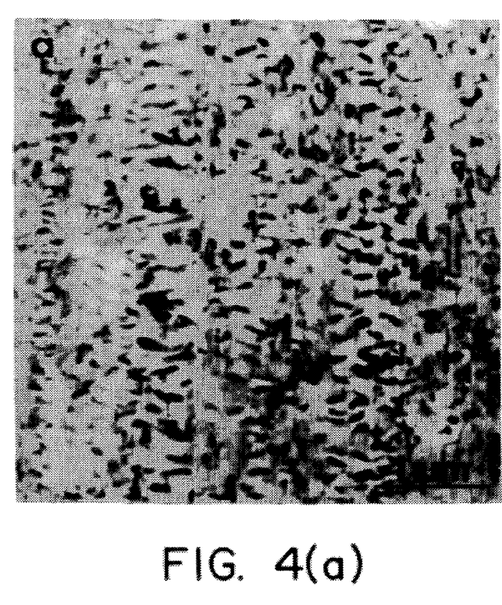
FIG. 4(a) and 4(b) show a TEM picture of the DMQqT film and an electron beam diffraction spectrum of the DMQqT film of Example 2, respectively.
Figure 4B:
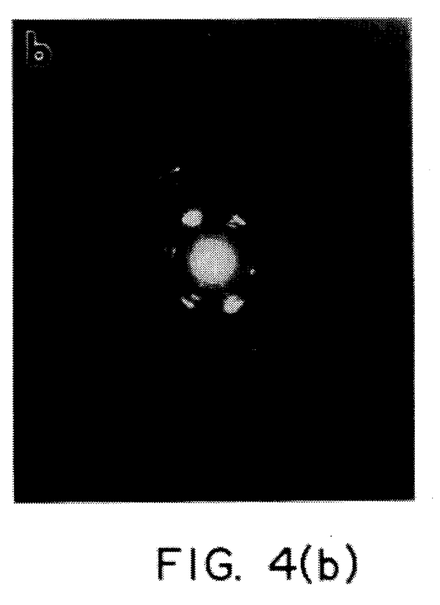

A glass substrate formed with a PTFE oriented film was placed in a vacuum deposition apparatus, and 5,5''''-dimethyl quinquethiophene (DMQqT) was deposited on the glass substrate under $1 \times 10^{-5}$ Torr degree of vacuum. More specifically, 10 mg of DMQqT was placed in a tungsten boat, and DMQqT was deposited to the glass substrate by resistance heating while the distance between the deposition source and the substrate surface was kept at 10 cm. For the above-noted procedure, 26–27 Amps of electric current was supplied to the deposition source. FIG. 3 shows the absorption spectrum of the DMQqT film. The absorption of oligothiophene molecules in the direction parallel to the PTFE molecular chains was significantly large according to this observation. Particularly, with 3.5 eV photoabsorption energy at $\pi$–$\pi$* transition, the ratio of the absorption intensity of the oligothiophene molecules parallel to the PTFE molecular chain direction (oriented direction of PTFE) to the absorption intensity of the molecules perpendicular to the PTFE molecular chain direction was about 1.45. In case of depositing DMQqT directly on the glass substrate which was not formed with PTFE oriented film, the oligothiophene molecular chains were crystallized in the vertical direction to the substrate surface. In case of depositing DMQqT on the PTFE oriented film, the oligothiophene molecular chains were crystallized parallel to the oriented direction of the PTFE molecular chains. FIG. 4(a) is a TEM picture of an oriented DMQqT film. FIG. 4(b) is an electron beam diffraction diagram of an oriented DMQqT film.

EXAMPLE 3

Figure 5:
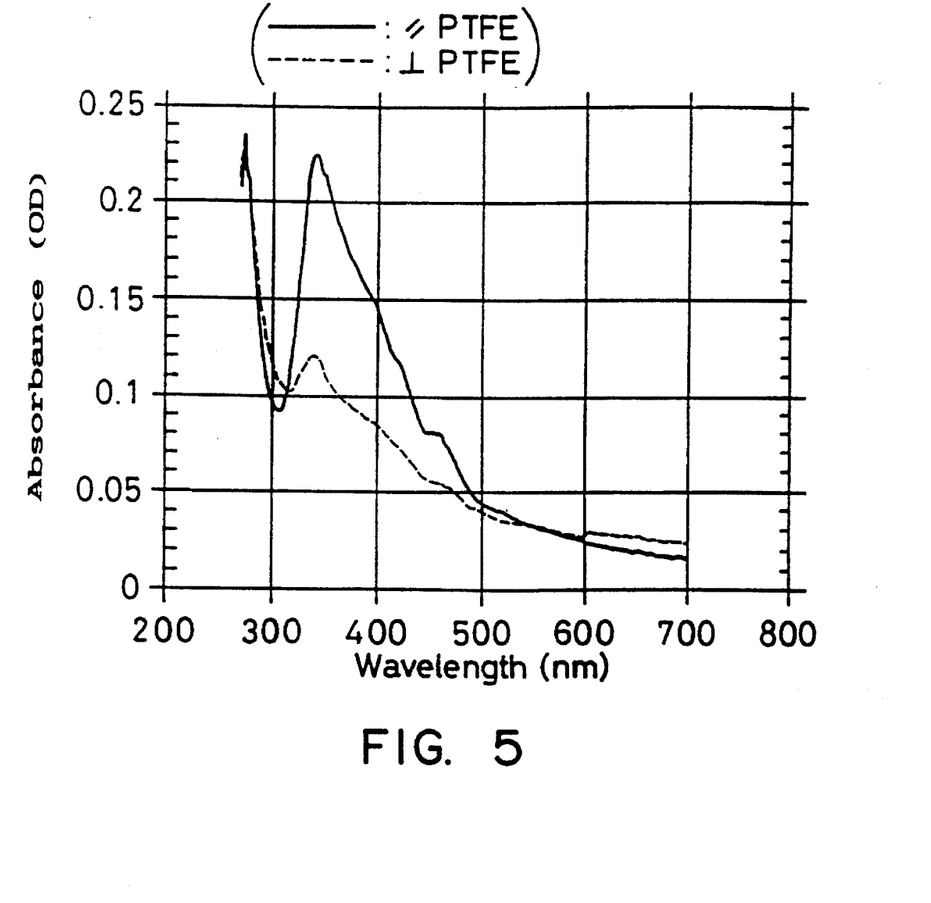
FIG. 5 shows a polarization absorption spectrum of the DMQtT film of Example 3.
Figure 6A:
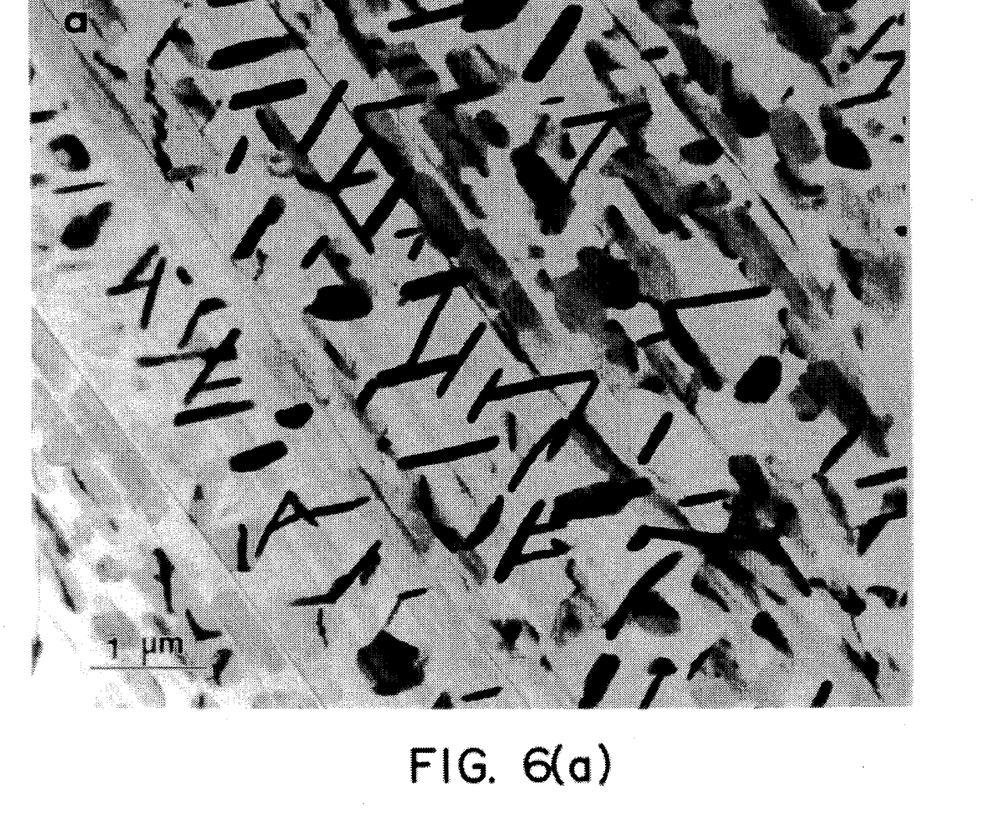
FIG. 6(a) and 6(b) show a TEM picture of the DMQtT film and an electron beam diffraction diagram of the DMQtT film of Example 3, respectively.
Figure 6B:
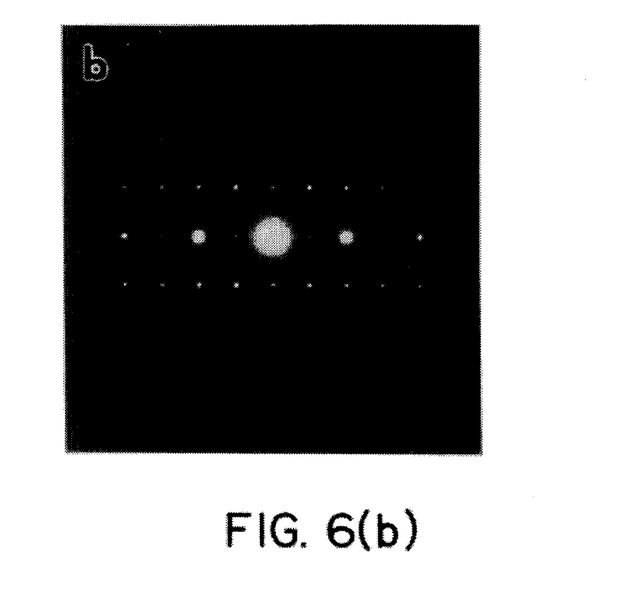

A glass substrate formed with a PTFE oriented film was placed in a vacuum deposition apparatus, and 5,5''''-dimethyl quaterthiophene (DMQtT) was deposited to the glass substrate under $1 \times 10^{-5}$ Torr degree of vacuum. More specifically, 10 mg of DMQtT was placed in a tungsten boat, and DMQtT was deposited on the substrate by resistance heating while the distance between the deposition source and the substrate surface was kept at 10 cm. For the above-mentioned procedure, 23–24 Amps of electric current was supplied to the deposition source. FIG. 5 shows the absorption spectrum of the DMQtT film. The absorption of oligothiophene molecules in the direction parallel to PTFE molecular chains was significantly large according to this observation. Particularly, with 3.7 eV photoabsorption energy at $\pi$–$\pi$* transition, the ratio of the absorption intensity of the oligothiophene molecules parallel to the PTFE molecular chain direction (oriented direction of PTFE) to the absorption intensity of the molecules perpendicular to the PTFE molecular chain direction was about 1.6. In case of depositing DMQtT directly on the glass substrate which was not formed with the PTFE oriented film, the oligothiophene molecular chains were crystallized in the vertical direction to the substrate surface. In case of depositing DMQtT on the PTFE oriented film, the oligothiophene molecular chains were crystallized parallel to the PTFE orientation direction. FIG. 6(a) is a TEM picture of an oriented DMQtT film. FIG. 6(b) is an electron beam diffraction diagram of an oriented DMQtT film.

EXAMPLE 4

Figure 7:
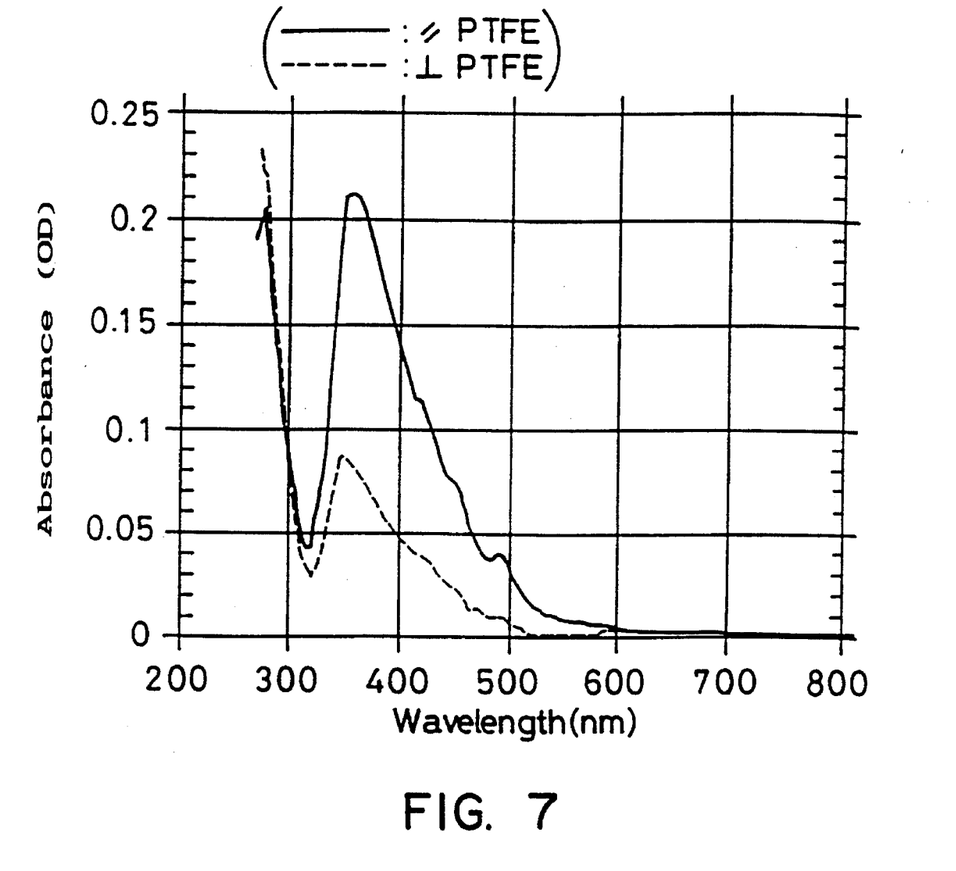
FIG. 7 shows a polarization absorption spectrum of a substrate of Example 4 deposited with DMQqT while the substrate was heated.

A glass substrate formed with a PTFE oriented film was placed in a vacuum deposition apparatus, and 5,5''''-dimethyl quinquethiophene (DMQqT) was deposited on the glass substrate under $1 \times 10^{-5}$ Torr degree of vacuum. In the deposition procedure, the glass substrate was heated to 80° C. More specifically, 2 mg of DMQqT was placed in a tungsten boat, and DMQqT was deposited on the substrate by resistance heating while the distance between the deposition source and the substrate surface was kept at 10 cm. For the above-mentioned procedure, 26–27 Amps of electric current was supplied to the deposition source. The dichroism of absorption spectrum of the DMQqT film was measured. FIG. 7 shows the absorption spectrum of the DMQqT film. The absorption of oligothiophene molecules in the direction parallel to PTFE molecular chains was significantly large according to the observation. Particularly, with 3.5 eV photoabsorption energy at $\pi$–$\pi$* transition, the ratio of the absorption intensity of the oligothiophene molecules parallel to the PTFE molecular chain direction (oriented direction of PTFE) to the absorption intensity of the molecules perpendicular to the PTFE molecular chain direction was about 2.44.

EXAMPLE 5

5,5''''-Dimethyl sexithiophene was prepared as follows. N-bromo succinimide (0.1 mol, 17.80 g) and 2,2'-bithiophene (0.1 mol, 16.63 g) were each suspended or dissolved in 125 ml methanol, and they were mixed to prepare 5-bromo-2,2'-bithiophene.

2-Methyl-5-bromothiophene was prepared according to the method disclosed by R. M. Kellogg et al. (J. Org. Chem., 33, 2902 (1968)). The product was then purified by vacuum distillation. The product (0.092 mol, 16.80 g) took out of the purified product was dissolved in diethyl ether (60 ml) and added to 120 ml of diethyl ether dispersed with magnesium of equimole (2.24 g) through a separating funnel. The mixture was then stirred for 4 h to prepare a Grignard reagent. To this was added 1,3-bis(diphenylphosphino)propane nickel (II) chloride (0.75 g). The solution of the above prepared 5-bromo-2,2'-bithiophene in diethyl ether (70 ml) was added dropwise and stirred overnight. After 4 h reflux, a yellow product of 5-methyl-2,2':5',2''-terthiophene (16.5 g) represented by Formula (4) was obtained.

Formula (4)

This product was subjected to recrystallization from methanol (320 ml) to provide a crystal (8.7 g).

4.0 g of the obtained crystal was dissolved in acetone (40 ml). 3.0 g of n-bromo succinimide was dissolved in acetone (40 ml). Those two solutions were mixed to obtain a precipitate of 5-methyl-5"-bromo-2,2':5',2"-terthiophene. This precipitate was filtered and washed with a large amount of water. The precipitate was subjected to recrystallization from methanol (750 ml) to provide a crystal (2.52 g).

Distilled tetrahydrofuran (THF, 70 ml) was added to a solid mixture of bis(triphenylphosphine) nickel (II) chloride (1.93 g), a powdered zinc (3.86 g) and tetrabutylammonium iodide (10.91 g), and the mixture was stirred until the suspend was turned dark reddish-brown. The above crystal was introduced to this suspend and heated to 80° C. before 5 h reflux. The solution was cooled and treated with 3-equivalent hydrochloric acid (120 ml) to obtain a reddish-brown product of 5,5""-dimethyl sexithiophene (1.2 g). This product was subjected to recrystallization from chlorobenzene to obtain a metallic orange crystal.

The method of manufacturing an FET where an organic semiconductor layer of 5,5""-dimethyl sexithiophene is deposited on a silicon/PTFE film will be explained with reference to FIG. 8(a)–(d).

PTFE oriented film 14 was formed on a thermally oxidized film over n-doped silicon substrate 11 as follows.

Substrate 11 having a thermally oxidized film for gate insulating film 12 was heated to 300° C. A rod 13 of PTFE was slid on substrate 11 in a direction at a rate of 1 mm/sec with substrate 11 applied with a pressure of 1 kg/cm² to form PTFE oriented film 14. The rod 13 was also heated to a similar temperature. The thermally oxidized film and the PTFE oriented film 14 have a thickness of 100 and 50 nm, respectively.

To form source and drain electrodes 15, chromium and gold were deposited in $1\times10^{-5}$ Torr degree of vacuum using a mask for ctenoid-shaped electrode. Chromium was first deposited in a thickness of about 15 nm, and then, gold was deposited in a thickness of about 150 nm. This order of deposition improves adhesion of the gold electrode to the substrate.

An organic semiconductor layer of 5,5""-dimethyl sexithiophene (DMSxT) was deposited by resistance heating with part of electrodes 15 covered with an aluminum foil while the distance between the deposition source and the substrate surface was kept at 10 cm. DMSxT was placed in a tungsten boat. For the above-noted procedure, 29–30 Amps of electric current was supplied to the deposition source. The thickness of DMSxT layer was about 500 nm. Here, the ctenoid-shaped electrode was used for source and drain electrodes 15 of the objective FET. A surface of silicon substrate on which no DMSxT layer was deposited was polished, and an oxide film, which was generated in air, was also removed by shaving to produce both a gate electrode from silicon substrate 11 and a gate insulating layer from the thermally oxidized layer. The channel length of the resulting FET was 200 μm, and the channel width was 6 mm. The I-V characteristics was measured by a semiconductor parameter analyzer (4145 A, Yokogawa-Hewlett-Packard Ltd.) after connection of each electrode of the FET with a gold line of which diameter was 0.1 mm through silver paste so that the mobility was calculated. That calculation was performed in accordance with the formula disclosed by S. M. Sze, "Physics of semiconductor device" 2nd. ed., 440 (Wiley, New York, 1981). Specifically, the relation represented by Formula (5) holds in a linear region of I—V characteristics.

$$I_D = (\mu C_O Z/L)[(V_G - V_T)V_D - V_{D2}/2]$$ Formula (5)

wherein $C_O$ represents capacitance of the gate insulating layer per unit area, Z represents channel width, L represents channel length, $V_T$ represents a threshold voltage, and $V_G$ and $V_D$ represent gate electrode voltage and drain electrode voltage, respectively. When PTFE oriented film is formed on a silicon thermally oxidized film, the capacitance used here corresponds to a series capacitance between a capacitance of the silicon thermally oxidized film and that of the PTFE film. Further, the relation of $\Delta I_D$ to $\Delta V_G$, represented by Formula (6), holds when a drain voltage $V_D$ is constant and Formula (5) is simplified.

$$\Delta I_D/\Delta V_G = (\mu C_O Z/L)V_D$$ Formula (6)

The mobility was calculated by substituting values provided by I—V characteristics into Formula (6).

The direction of the electric field applied to source and drain electrodes was made to agree with that of the orientation PTFE molecule chains. As a result, a mobility of $1.4\times10^{-2}$ cm²/V·s was obtained.

Furthermore, another mobility was similarly determined using the same type of FET device except that the direction of the electric field applied to the source and drain electrodes was set perpendicular to that of the orientation PTFE molecule chains. The channel width was 200 μm and the channel length was 6 mm. As a result of a similar calculation, a mobility of $2.36\times10^{-3}$ cm²/V·s was obtained, which confirmed mobility anisotropy in the orientation direction.

EXAMPLE 6

A PTFE oriented film and electrodes were sequently formed on a 100 nm thick thermally oxidized film over n-doped silicon substrate 11 in the same manner as in Example 5.

An organic semiconductor layer of 5,5""-dimethyl quinquethiophene (DMQqT) was deposited by resistance heating with part of electrodes 15 covered with aluminum foil while the distance between the deposition source and the substrate surface was kept at 10 cm. DMQqT was placed in a tungsten boat. For the above-noted procedure, 26–27 Amps of electric current was supplied to the deposition source. The thickness of DMQqT layer was about 500 nm. An FET was formed in the same manner as in Example 5. The channel length was 100 μm, and the channel width was 6 mm.

Further, the I—V characteristics was measured to calculate mobility in the same manner as in Example 5. As a result, a mobility of $3.5\times10^{-3}$ cm²/V·s was obtained. The direction of the electric field applied to source and drain electrodes was made to agree with that of the orientation PTFE molecule chains. On the other hand, another mobility was similarly determined using the same type of FET device except that the direction of the electric field applied to source and drain electrodes was set perpendicular to that of the orientation PTFE molecule chains. The channel width was 200 μm and the channel length was 6 mm. As a result of a similar calculation, a mobility of $4.74\times10^{-4}$ cm²/V·s was obtained, which confirmed mobility anisotropy in the orientation direction.

Comparative Example

Ctenoid-shaped source and drain electrodes were formed on a 100 nm thick thermally oxidized film over n-doped silicon substrate in the same manner as in Example 5. Chromium was first deposited in a thickness of about 15 nm, and then, gold was deposited in a thickness of about 150 nm in the same manner as in Example 5.

An organic semiconductor layer of 5,5''''-dimethyl quinquethiophene (DMQqT) was deposited in the same manner as in Example 6 with part of the electrodes covered with aluminum foil. A surface of silicon substrate on which no DMSxT layer was deposited was polished, and an oxide film, which was generated in air, was also removed by shaving to produce a gate electrode from silicon substrate. An FET having no PTFE oriented film was thus formed. The resulting FET had a channel length of 200 µm and a channel width of 6 mm.

The mobility for the comparative FET was calculated in the same manner as in Example 5. As a result, a mobility of $2.5 \times 10^{-4} cm^2/V \cdot s$ was obtained.

The preparation of DMQqT was in accordance with the disclosure of Japanese Unexamined Patent Publication No. HEI 4-133351. The procedure will be explained.

2-Methyl-5-iodin-thiophene was prepared according to the method disclosed by J. M. Baker et al., Synthetic Communications, vol. 5, pp. 59–64 (1975). The product was then purified by vacuum distillation. The product (0.1 mol, 22.4 g) took out of the purified product was dissolved in diethyl ether (60 ml) and added to 120 ml of diethyl ether dispersed with magnesium of equimole (2.4 g) through a separating funnel. The mixture was then stirred for 4 h to prepare a Grignard reagent. To this reagent were added 1,3-bis(diphenylphosphino)propane nickel (II) chloride (0.75 g) and 5,5"-dibromoterthiophene (0.04 mol, 16.2 g) in a solid state. This mixture was stirred overnight and refluxed for 4 h to obtain 5,5''''-dimethyl quinquethiophene. This product was subjected to recrystallization from chlorobenzene to provide a gold luster crystal. Further, 5,5''''-dimethyl quinquethiophene was similarly prepared using 2-methyl-5-bromophiophene instead of 2-methyl-5-iodin-thiophene. This product was also subjected to recrystallization from chlorobenzene to obtain gold luster crystal.

EXAMPLE 7

A PTFE oriented film and electrodes were sequently formed on a thermally oxidized film over n-doped silicon substrate in the same manner as in Example 5.

Both 5,5'''-dimethyl quaterthiophene (DMQtT) and 5,5''''-dimethyl quinquethiophene (DMQqT) were together deposited by resistance heating with part of electrodes with aluminum foil while the distance between the deposition source and the substrate surface was kept at 10 cm. DMQtT (6.6 mg) and DMQqT (3.4 mg) were placed in a tungsten boat. For the above-noted procedure, 24–26 Amps of electric current was supplied to the deposition source. An FET was formed in the same manner as in Example 5. The channel length was 200 µm, and the channel width was 6 mm. As a result of similar calculation as in Example 5, a high mobility of $6.4 \times 10^{-2} cm^2/V \cdot s$ was obtained.

Another FET formed using an equivalent weight of DMQtT and DMQqT provided a mobility of $2.9 \times 10^{-2} cm^2/V \cdot s$. The kind and mixture ratio of oligothiophene compounds are not critical to this embodiment and other kinds and ratios can be suitably selected. In this FET, the direction of the electric field applied to source and drain electrodes was made to agree with that of the orientation PTFE molecule chains.

Figure 9:
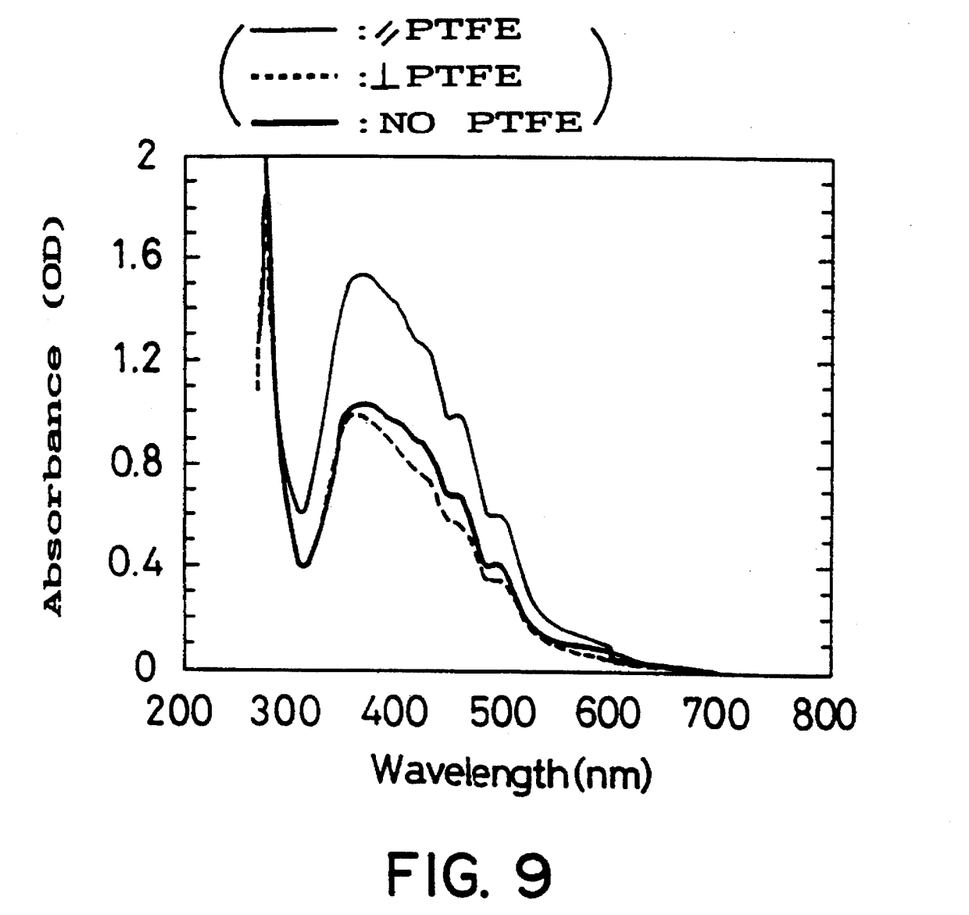
FIG. 9 shows a polarized spectrum of a thin layer of a mixed organic materials of Example 7.

FIG. 9 shows a polarized spectrum of a mixed thin layer composed of an equivalent weight of DMQtT and DMQqT. Peaks at 460 and 400 nm are due to DMQtT, and peaks at 500 and 430 nm are due to DMQqT. It is clear that the absorbance of the orientation molecule parallel to PTFE oriented film is larger than that of the orientation molecule perpendicular to PTFE oriented film. This means that the long molecular chains of both compounds are oriented parallel to PTFE oriented film.

In comparison, an FET having no PTFE oriented film and a deposited layer of DMQtT or DMQqT exhibited a mobility of $1.4 \times 10^{-4} cm^2/V \cdot s$ or $2.5 \times 10^{-4} cm^2/V \cdot s$. The mobility provided by this embodiment was 460 or 130 times higher than those mobilities of the comparative FETs. The mobility of oligothiophene generally increases with polymerization degree. A mixed thin film of DMQtT and DMQqT remarkably exhibited a much higher mobility than a film of DMQtT or DMQqT alone. This effect results from the mixture of the compounds. Therefore, the orientation of at least two oligothiophene compounds in one direction at a time improves characteristics of FET.

The preparation of DMQtT was in accordance with the disclosure of Japanese Unexamined Patent Publication No. HEI 4-133351. The procedure will be explained.

2-Methyl-5-bromothiophene was prepared in the manner as in Example 1, and purified by vacuum distillation. The product (0.1 mol, 17.7 g) took out of the purified product was dissolved in diethyl ether (60 ml) and added to 120 ml of diethyl ether dispersed with magnesium of equimole (2.4 g) through a separating funnel. The mixture was then stirred for 4 h to prepare a Grignard reagent. To this reagent were added 1,3-bis(diphenylphosphino)propane nickel (II) chloride (0.75 g) and 5,5"-dibromobithiophene (0.04 mol, 13.0 g) in a solid state. This mixture was stirred for about 24 h and refluxed for 4 h to obtain 5,5'''-dimethyl quaterthiophene This product was subjected to recrystallization from acetone to provide a needle crystal of gold luster.

EXAMPLE 8

A PTFE oriented film and electrodes were sequentially formed on a 500 nm thick thermally oxidized film over n-doped silicon substrate in the same manner as in Example 5.

On this device, 1 wt% solution of poly(2-methoxy, 5-(2'-ethylhexyloxy)- 1,4-phenylenvinylene) (MEH-PPV) in xylene was applied by the spin-coating method to form an MEH-PPV oriented film having a thickness of about 150 nm. The device had a channel length of 100 µm and a channel length of 6 mm. As a result of a similar calculation, a mobility of $1.2 \times 10^{-3} cm^2/V \cdot s$ was obtained.

As a comparative example, the same type of FET device without PTFE oriented film exhibited a mobility of $4.2 \cdot 10^{-4} cm^2/V \cdot s$. In this FET, the direction of the electric field applied to the source and drain electrodes was made to agree with that of the orientation of the PTFE molecule chains.

Polarized light observation confirms that the orientation of the MEH-PPV film is not remarkable compared to that of oligothiophene. The properties of FET device is dependent on the properties of the organic electron material layer (channel part) within the depth of about 10 nm from the interface of the organic electron material layer and the gate insulating layer. Therefore, the good orientation of the channel part improves the characteristics of devices even if the whole MEH-PPV film is not fully oriented.

In this embodiment, other conducting polymers, such as polythiophene, which are superior in solubility, can similarly be used, instead of MEH-PPV. Even conducting polymers having poor solubility to a solvent can sufficiently be formed into a film by appropriate methods such as electrolytic polymerization. An example of the appropriate methods is disclosed in A. Tsumura, H. Koezuka and T. Ando, Appl. Phys. Lett., 49, 18, 1210 (1986). Those conducting polymers in the state of no-orientation only exhibit a mobility of $10^{-4}$ cm$^2$/V·s at most. Examples of determining a mobility of conductive polymers include are disclosed in other literture, for example, (a) A. Tsumura et al, Apply. Phys. Lett., 49, 18, 1210 (1986) regarding FET device comprising an n-type silicon substrate, a silicon oxide film thereon and an organic semiconductor layer of polythiophene, (b) A. Assadi, C. Svensson et al, Appl. Phys. Lett., 53, 3, 195 (1988) regarding FET device comprising an n-type silicon substrate, a silicon oxide film thereon and an organic semiconductor layer of poly(3-hexyloxythiophene), (c) J. H. Burroughes, C. A. Jones and R. H. Friend, Nature, 335, 137 (1988) regarding FET device comprising an n-type silicon substrate, a silicon oxide film thereon and an organic semiconductor layer of polyacetylene, and the like.

In contrast, polyphenylene vinylene or its derivatives showing a relatively high mobility around $4\times10^4$ cm$^2$/V·s are effective for an organic semiconductor film. In particular, MEH-PPV among phenylene vinylene derivatives is preferred because of solubility. Further, polythienylene vinylene or its derivatives having a similar chemical structure are also used. The properties of polythienylene vinylene or its derivatives are disclosed, for example, in H. Fuchigami, A. Tsumura and H. Koezuka, Apply. Phys. Lett., 63, 10 (1372 (1993). As disclosed, polythienylene vinylene exhibits a mobility of 0.22cm$^2$/V/s in the state of no-orientation.

As explained above, this invention provides oriented films formed of conducting organic materials for use in a variety of electron devices by contacting oligothiophene compounds, polyphenylene vinylene or its derivatives with PTFE oriented film on a substrate for increasing the mobility of conducting electrons in the material.

Further, this invention also provides organic electronic devices, such as FET, having a high mobility by using an oligothiophene oriented film, a mixed oligothiophene film or an oriented film thereof or polyphenylene vinylene oriented film.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A method of manufacturing a conducting organic oriented film comprising the steps of forming a polytetrafluoroethylene oriented film on a substrate, and contacting an oligothiophene compound represented by Formula (1) with the polytetrafluoroethylene oriented film:

Formula (1)

wherein n represents an integer of 3 to 6, and R represents a hydrogen atom or an alkyl group having 1 to 2 carbon atoms.

2. The method of manufacturing a conducting organic oriented film according to claim 1, wherein the step of contacting said oligothiophene compound with said polytetrafluoroethylene oriented film is carried out using a gaseous-phase method or a casting method.

3. The method of manufacturing a conducting organic oriented film according to claim 1, wherein said polytetrafluoroethylene oriented film is heated when said oligothiophene compound is contacted with said polytetrafluoroethylene oriented film.

4. The method of manufacturing a conducting organic oriented film according to claim 1, wherein said oligothiophene compound has a polymerization degree between four and six.

5. The method of manufacturing a conducting organic oriented film according to claim 1, wherein the α position at the ends of the oligothiophene molecules is substituted by a group selected from the group consisting of alkyl groups, alkylthio groups and trimethylsilyl group.

6. The method of manufacturing a conducting organic oriented film according to claim 5, wherein said alkyl group or alkylthio group has one or two carbon atoms.

7. A method of manufacturing an organic electronic device having a substrate and a pair of electrodes facing each other, comprising the steps of forming a polytetrafluoroethylene oriented film on a substrate, and contacting an oligothiophene compound with said polytetrafluoroethylene oriented film to form an organic oriented film on said polytetrafluoroethylene oriented film between said pair of electrodes wherein the long axis of oligothiophene molecules is oriented to the orientation of said polytetrafluoroethylene oriented film and crystallized.

8. The method of manufacturing an organic electronic device according to claim 7, wherein at least two oligothiophene compounds are contacted with said polytetrafluoroethylene oriented film.

9. The method of manufacturing an organic electronic device according to claim 7, wherein said oligothiophene compound has a polymerization degree between four and six.

10. The method of manufacturing an organic electronic device according to claim 7, wherein the α position at the ends of the oligothiophene molecules is substituted by a group selected from the group consisting of alkyl groups, alkylthio groups and trimethylsilyl group.

11. The method of manufacturing an organic electronic device according to claim 10, wherein said alkyl group or alkylthio group has one or two carbon atoms.

12. The method of manufacturing an organic electronic device according to claim 7, wherein the step of contacting said oligothiophene compound with said polytetrafluoroethylene oriented film is carried out using a gaseous-phase method or a casting method.

13. The method of manufacturing an organic electronic device according to claim 12, wherein said polytetrafluoroethylene oriented film is heated when said oligothiophene compound is contacted with said polytetrafluoroethylene oriented film by said gaseous-phase method.

14. A method of manufacturing an organic electronic device having a substrate and a pair of electrodes facing each other, comprising the steps of forming a polytetrafluoroethylene oriented film on a substrate, and contacting a polyphenylene vinylene represented by Formula (2) or its derivative with said polytetrafluoroethylene oriented film to form an organic oriented film on said polytetrafluoroethylene oriented film between said pair of electrodes:

Formula (2)

wherein n represents an integer.

15. The method of manufacturing an organic electronic device according to claim 14, wherein said polyphenylene vinylene derivative is poly(2-methoxy, 5-(2'-ethylhexyloxy)-1,4-phenylene vinylene) represented by Formula (3):

Formula (3)

wherein n represents an integer.

16. The method of manufacturing an organic electronic device according to claim 14, wherein the step of contacting said polyphenylene vinylene or its derivative with said polytetrafluoroethylene oriented film is carried out using a casting method.

* * * * *

UNITED STATES PATENT AND TRADEMARK OFFICE
CERTIFICATE OF CORRECTION

PATENT NO. : 5,546,889
DATED : August 20, 1996
INVENTOR(S) : Katsuya Wakita et al.

It is certified that error appears in the above-identified patent and that said Letters Patent is hereby corrected as shown below:

Column 13,
Line 67, please replace "film:" with -- film; --;

Column 14,
Line 8, please replace "atoms." with -- atoms; wherein the long axis of the oligothiophene molecules is oriented to the orientation of said polytetrafluoroethylene oriented film and crystallized. --

Signed and Sealed this

First Day of March, 2005

JON W. DUDAS
*Director of the United States Patent and Trademark Office*